(12) United States Patent
Hasegawa et al.

(10) Patent No.: US 11,177,229 B2
(45) Date of Patent: Nov. 16, 2021

(54) IC CHIP LAYOUT FOR MINIMIZING THERMAL EXPANSION MISALIGNMENT

(71) Applicant: SYNAPTICS INCORPORATED, San Jose, CA (US)

(72) Inventors: Naoki Hasegawa, Tokyo (JP); Shinya Suzuki, Tokyo (JP); Hiromasa Hiura, Tokyo (JP); Yuichi Nakagomi, Tokyo (JP)

(73) Assignee: Synaptics Incorporated, San Jose, CA (US)

( * ) Notice: Subject to any disclaimer, the term of this patent is extended or adjusted under 35 U.S.C. 154(b) by 8 days.

(21) Appl. No.: 16/838,047

(22) Filed: Apr. 2, 2020

(65) Prior Publication Data
US 2020/0321298 A1    Oct. 8, 2020

Related U.S. Application Data

(60) Provisional application No. 62/829,927, filed on Apr. 5, 2019.

(51) Int. Cl.
*H01L 23/00* (2006.01)

(52) U.S. Cl.
CPC ............. *H01L 24/13* (2013.01); *H01L 24/05* (2013.01); *H01L 2924/15311* (2013.01)

(58) Field of Classification Search
CPC combination set(s) only.
See application file for complete search history.

(56) References Cited

U.S. PATENT DOCUMENTS

| 8,129,840 B2* | 3/2012 | Jo ........................... H01L 24/06 257/737 |
| 9,125,332 B2* | 9/2015 | Pendse ................. H05K 3/3452 |
| 2002/0033531 A1* | 3/2002 | Matsushima ........... H01L 24/11 257/734 |
| 2007/0166881 A1* | 7/2007 | Liu ......................... H01L 24/13 438/108 |
| 2009/0001567 A1* | 1/2009 | Shih ........................ H01L 24/14 257/737 |
| 2009/0278263 A1* | 11/2009 | McCarthy .............. H01L 24/02 257/778 |
| 2019/0221520 A1* | 7/2019 | Kim ........................ H01L 24/14 |
| 2020/0103992 A1* | 4/2020 | Sauer .................... G06F 3/0416 |
| 2021/0151403 A1* | 5/2021 | Chipalkatti ............ H01L 24/14 |

* cited by examiner

*Primary Examiner* — Mamadou L Diallo
(74) *Attorney, Agent, or Firm* — Ferguson Braswell Fraser Kubasta PC

(57) ABSTRACT

An integrated circuit (IC) chip comprises a plurality of pads and a plurality of bumps. The plurality of pads includes a first pad. The plurality of bumps is disposed on the plurality of pads. The plurality of bumps includes a first bump disposed on the first pad. The first bump as a width that is different than an exposed with of the first pad. The center of the first bump is not aligned with a center of the first pad.

13 Claims, 10 Drawing Sheets

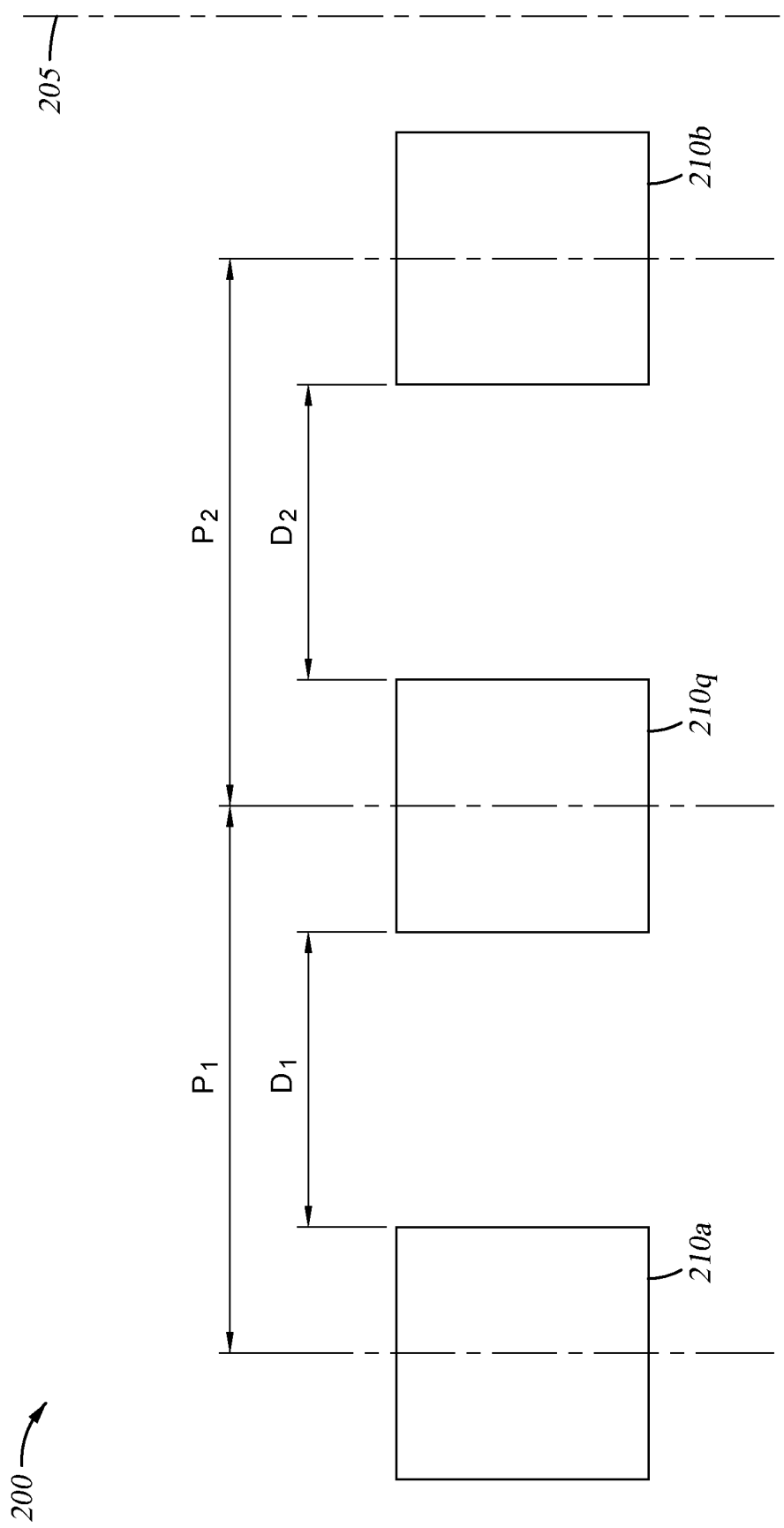

IC CHIP LAYOUT FOR MINIMIZING THERMAL EXPANSION MISALIGNMENT

CROSS-REFERENCE TO RELATED APPLICATIONS

This application claims priority to U.S. provisional patent application Ser. No. 62/829,927, filed Apr. 5, 2019, which is incorporated by reference herein in its entirety.

BACKGROUND

Field

Embodiments disclosed herein generally relate to integrated circuits, and more specifically, to an improved bump layout for an integrated circuit.

Description of the Related Art

In many conventional electronic devices, integrated circuit (IC) chips are mounted on a substrate of the electronic device. One common technique for mounting the IC chip to the electronic device comprises crimping the IC chip to the substrate, during which the IC chip is exposed to high temperature conditions. Exposing the IC chip to high temperature conditions may cause the IC chip to expand relative to the substrate, which may result in stress and misalignment between one or more bumps on the IC chip and one or more bumps on the substrate. The excess stress and/or misalignment between the bumps may negatively affect the electrical connection between the IC chip and the substrate as well as the electrical connection between the IC chip and the corresponding electronic device. Thus, any misalignment between the bumps may prevent the IC chip from properly communicating with the electronic device, leading to a failure within the overall system.

FIG. 1 illustrates a portion of a die of a conventional IC chip 100 including bumps 110 having a common width "X." Because the bump configuration can vary between different electronic devices, the width of conventional bumps 110 may not provide sufficient tolerance for the IC chip 100 to be reliably mounted to each different electronic device. To remedy this issue, a different IC chip having a different bump layout is created for each different electronic device design. For example, the location of the bumps on the IC chip may be varied according to the design parameters of a corresponding electronic device. However, such an approach is costly, as a new IC chip is required for each different electronic device design.

Thus, there is a need for an improved IC chip bump design that may be utilized for various electronic device designs.

SUMMARY

In an example embodiment, an integrated circuit (IC) chip comprises a plurality of pads and a plurality of bumps. The plurality of pads includes a first pad. The plurality of bumps is disposed on the plurality of pads. The plurality of bumps includes a first bump disposed on the first pad. The first bump as a width that is different than an exposed width of the first pad. The center of the first bump is not aligned with a center of the first pad.

In an example embodiment, an electronic device comprises a substrate, a connector, and an IC chip. The substrate comprises first traces. The connector is coupled to the substrate and comprises first connector bumps and second traces. The second traces are coupled to the first connector bumps and the first traces. The IC chip comprises a plurality pads including a first pad. The IC chip further comprises a plurality of IC chip bumps disposed on the plurality of pads. The plurality of IC chip bumps includes a first IC chip bump disposed on the first pad. The first IC chip bump has a width that is different than an exposed width of the first pad. A center of the first IC chip bump is not aligned with a center of the first pad.

In an example embodiment, an IC chip module comprises a connector and a die. The connector comprises connector bumps. The die comprises a plurality of pads including a first pad. Further, the die comprises a plurality of die bumps disposed on the plurality of pads. The plurality of die bumps includes a first die bump disposed on the first pad. The first die bump has a width that is different than an exposed width of the first pad. The center of the first die bump is not aligned with a center of the first pad.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments, and are therefore not to be considered limiting of inventive scope, as the disclosure may admit to other equally effective embodiments.

FIG. 3A illustrates a portion of the bumps of a die of an integrated circuit chip, according to one or more embodiments.

Figure 1:
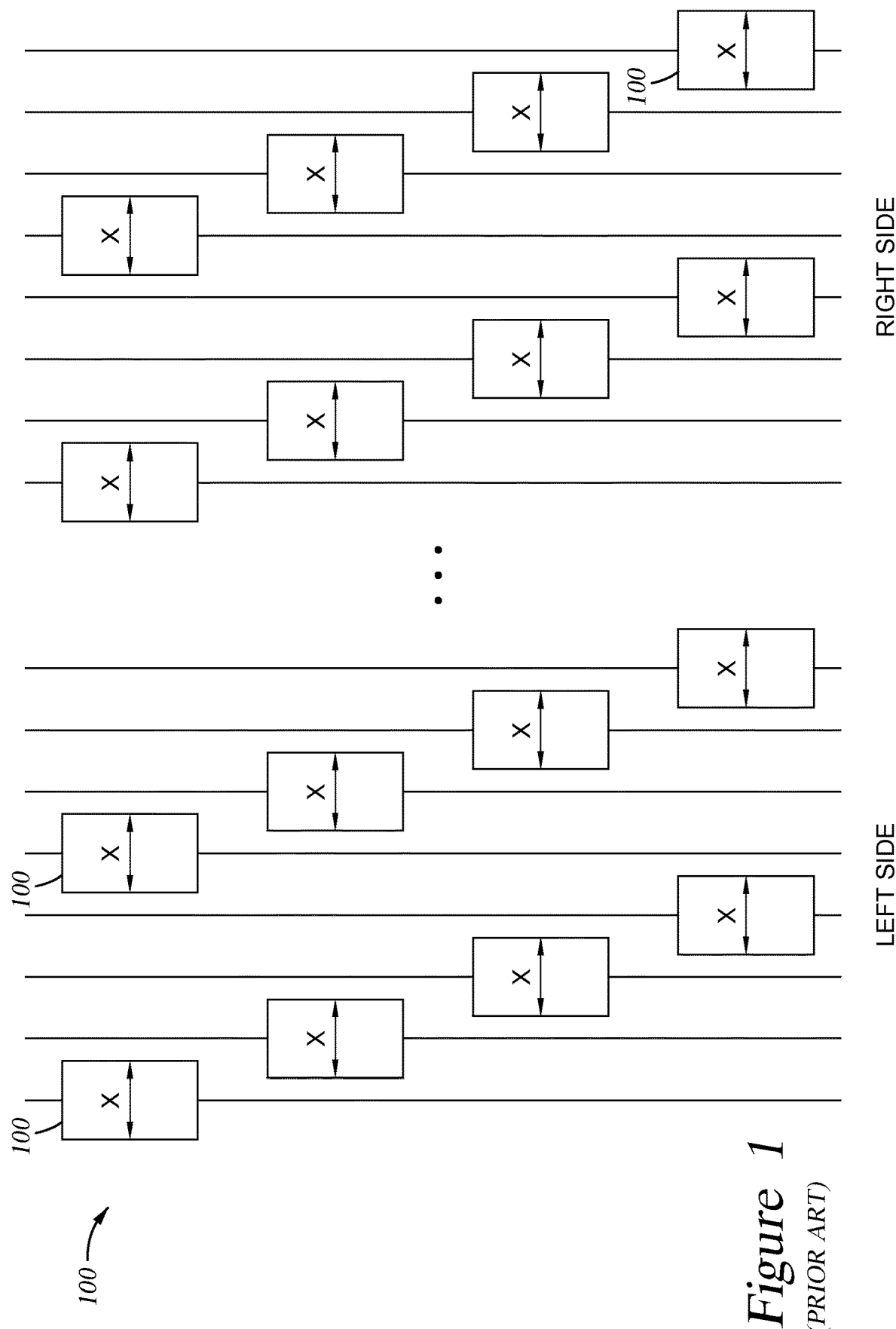
FIG. 1 illustrates a portion of a die of a conventional integrated circuit chip.

To facilitate understanding, identical reference numerals have been used, where possible, to designate identical elements that are common to the figures. It is contemplated that elements disclosed in one embodiment may be beneficially utilized on other embodiments without specific recitation. The drawings referred to here should not be understood as being drawn to scale unless specifically noted. Also, the drawings are often simplified and details or components omitted for clarity of presentation and explanation. The drawings and discussion serve to explain principles discussed below, where like designations denote like elements.

DETAILED DESCRIPTION

An integrated circuit (IC) chip is mounted to a substrate of an electronic device to electrically couple the IC chip to the electronic device. For example, a display driver IC (DDIC) chip or a touch display driver integration (TDDI) IC chip may be mounted to a substrate of a display device or a flexible connector connected to the display device. In one embodiment, the size of the bumps on the IC chip is increased. Increasing the size of the bumps may reduce thermal expansion misalignment between the IC chip bumps and the bumps on the substrate, thus reducing the probability of failure of the corresponding electronic device. Further, larger bumps can better accommodate size or configuration variations caused by different amount of thermal expansion between devices, thereby substantially eliminating the need to create a different IC chip for each electronic device.

Figure 2A:
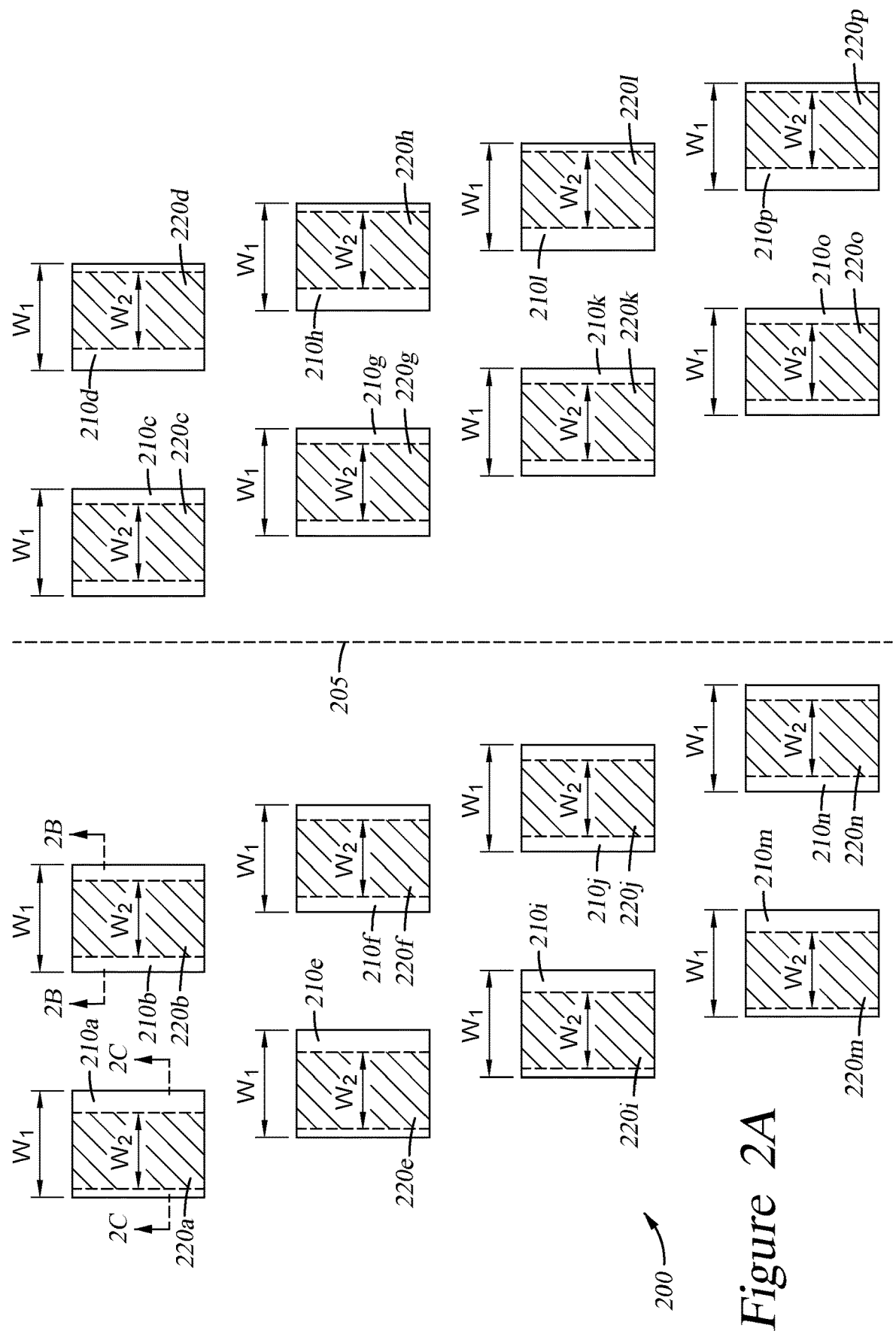
FIG. 2A illustrates a portion of a die of an integrated circuit chip, according to one or more embodiments.

FIG. 2A illustrates a portion of a die of an IC chip 200, according to one or more embodiments. The IC chip 200 includes bumps 210 that are utilized to create electrical connections between pads on the IC chip 200 and a corresponding component of an electronic device to which the IC chip 200 is mounted. The bumps 210 may be referred to as IC chip bumps or die bumps. The IC chip 200 may comprise more than 3000 bumps 210. However in other examples, the IC chip 200 may comprise less than 3000 bumps 210. The bumps 210 are formed from an electrically conductive material. In one embodiment, the bumps 210 include one or more layers of different electrically conductive materials, such as but not limited to gold and/or gold alloys. In other embodiments, the conductive materials comprising the bumps 210 may be tin, tin alloys, copper, and/or copper alloys, among others. In one embodiment, a solder ball (not shown) is disposed on the bumps 210 of the IC chip 200 to couple the bumps 210 with the bumps of a substrate of the electronic device, thus creating a mechanical and electrical connection between the IC chip 200 and the substrate of the electronic device. The term bump may infer the pillars, underbump metal layer, and/or solder utilized to electrically and mechanically couple the exposed surface of the pads 220 to the adjacent surface (e.g., the surface 203 of the IC chip 200 of FIG. 2D) of the electronic device to which the IC chip 200 is mounted.

Each of the bumps 210 is disposed over (i.e., overlaps) a corresponding pad (e.g., pads 220a-220p). The pads 220 are electrically coupled to circuitry (e.g., circuitry 230 shown in FIG. 2D) within the die (e.g., the die 202) of the IC chip 200. Further, the bumps 210 provide a path for electrical signals to be transmitted to and from the circuitry disposed within IC chip 200 to a corresponding electronic device. The pads 220 exposed on the surface of the die of the IC chip 200 are configured to provide a system ground signal, power signals, and signal paths to the circuitry disposed within the die 202 of the IC chip 200.

Figure 2B:
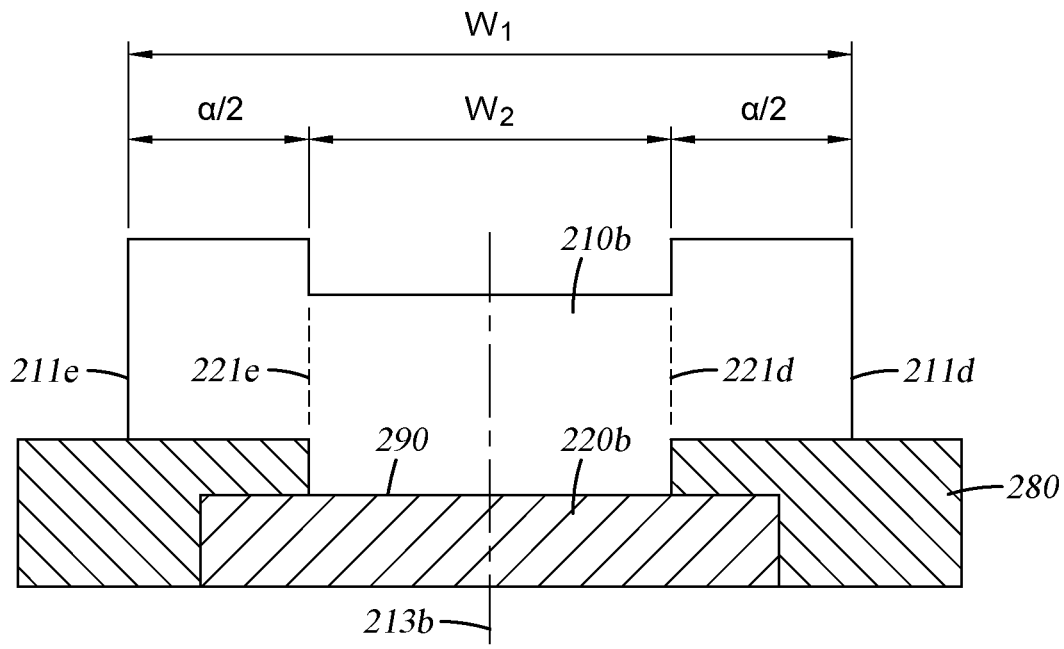
FIG. 2B illustrates a cross-sectional view of a portion of the bumps and pads of a die of an integrated circuit chip taken through section line 2B-2B shown in FIG. 2A, according to one or more embodiments.
Figure 2C:
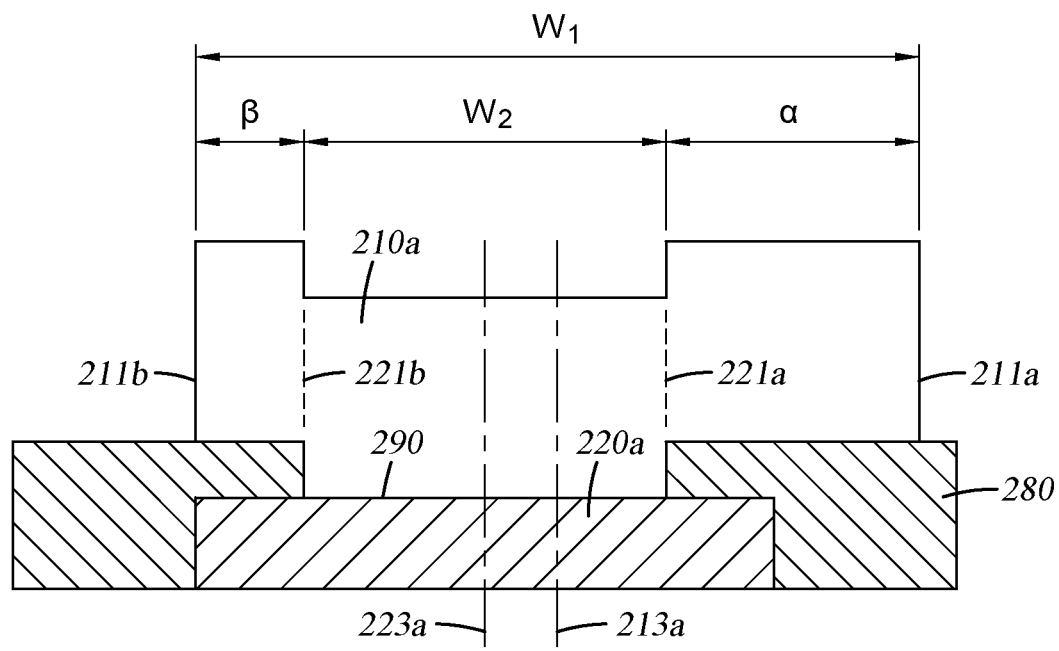
FIG. 2C illustrates a cross-sectional view of a portion of the bumps and pads of a die of an integrated circuit chip taken through section line 2C-2C shown in FIG. 2A, according to one or more embodiments.
Figure 2D:
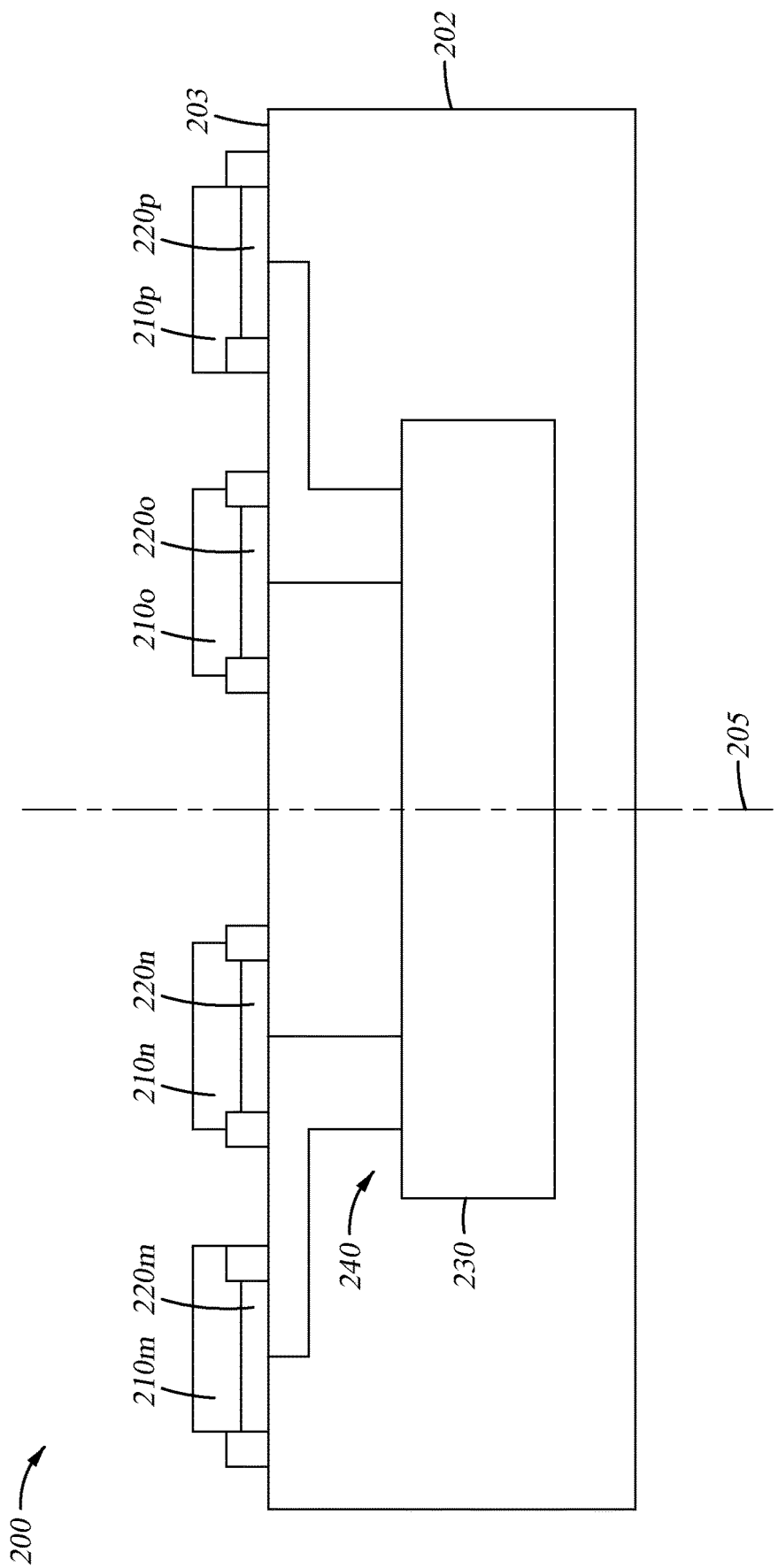
FIG. 2D illustrates a cross-sectional view of a die of an integrated circuit chip, according to one or more embodiments.

As illustrated in FIG. 2D, the bump 210m is disposed over and electrically coupled to pad 220m, the bump 210n is disposed over and electrically coupled to pad 220n, the bump 210o is disposed over and electrically coupled to pad 220o, and the bump 210p is disposed over and electrically coupled to pad 220p. The pads 220 are disposed on a surface 203 of the die 202. The pads 220 are coupled to the circuitry 230 of the die 202 via traces 240. The circuitry 230 may be display driver circuitry or sensor circuitry, among others.

In one example, the IC chip 200 is configured to be mounted to a substrate (as later described with reference to FIG. 5). The IC chip 200 may be an application specific IC (ASIC) chip. In one embodiment, the IC chip 200 is a DDIC chip configured to update a display image on a display device, for example, by driving one or more display electrodes of the display device with display update signals. In another embodiment, the IC chip 200 is a TDDI chip configured to both update a display image similar to a DDIC chip and detect presence of input objects similar to a touch controller IC chip, e.g., by driving one or more sensor electrodes of an input device with a sensing signal to acquire resulting signals and determine a location of an input object.

In one or more embodiments, the substrate (or connector) is a flexible connector, a flexible substrate, or any suitable substrate configured to receive the IC chip 200 (as later described with reference to FIG. 6). In one embodiment, the substrate is a 2L-COF (2-Layer Chip on Film) device and comprises COF (Chip on Film) wiring that couples the IC chip 200 to the electrodes of an electronic device. The IC chip 200 may be mounted to the substrate through a crimping process. In other embodiments, other techniques may be utilized for mounting the IC chip to the substrate.

In the embodiment of FIG. 2A, each of the bumps 210 is illustrated as overlapping a corresponding pad 220 (as indicated by the hatched areas). The width $W_1$ of the bumps 210 is different (i.e., larger or smaller) than an exposed width $W_2$ of the pads 220. In the example depicted in FIG. 2A, the width $W_1$ of the bumps 210 is larger than an exposed width $W_2$ of the pads 220. As shown in FIGS. 2B and 2C, the exposed width of a pad refers to the width of an exposed surface 290 of the pad that is exposed through the covering dielectric material 280, such as a solder resist or a passivation layer. In one or more embodiments, the width $W_1$ is about 10 um. In other embodiments, the width $W_1$ is of any suitable width, e.g., less than or greater than 10 um.

A center line 205 extends through the midpoint of one of the sides of the die 202 of IC chip 200, thus bifurcating the die 202 of the IC chip 200 into two equally sized portions. In a row of bumps 210 arranged orthogonally to the center line 205, a first bump 210 (e.g., bump 210c) closest to the center line 205 on one side of the center line 205 is closer to the center line 205 than a second bump 210 (e.g., bump 210b) closest to the center line 205 on the opposite side of the center line 205. Similarly, bumps 210 within the row arranged sequentially outward of the first bump 210 (e.g., bump 210d) relative to the center line 205 are closer to the center line 205 than sequentially corresponding bumps 210 (e.g. 210a) within the same row that are disposed outward of the second bump 210 relative to the center line 205.

As is illustrated in FIG. 2A, each of the bumps 210a and 210b has a width $W_1$ which is larger than the exposed width $W_2$ of the pads 220a and 220b respectively. However, while the center the bump 210b is aligned with the center of the pad 220b, the center of the bump 210a is not aligned with the center of the pad 220a. For example, as illustrated in FIG. 2B, the bump 210b and the pad 220b share a common center 213b and as illustrated in FIG. 2C the bump 210a has a center 213a that differs from a center 223a of the exposed surface 290 of the pad 220a. The exposed surface 290 is the surface of the pad 220a that is exposed through the dielectric material 280 such that the portion of the bump 210 contacting the exposed surface 290 provides the electrical communication path between the bump and the pad.

FIGS. 2B and 2C illustrate cross-sectional side views of bumps 210a and 210b and pads 220a and 220b of the IC chip 200, according to one or more embodiments. As illustrated in FIG. 2B, the edges 211d and 211e of the bump 210b are disposed outside the edges 221d and 221e of the exposed surface 290 of the pad 220b. Further, the distance between the edge 211d and the edge 221d is the same as the distance between the edge 211e and the edge 221e. For example, the bump 210b is larger than the exposed surface 290 of the pad 220b by "α." Accordingly, the distance between the edge 211d and the edge 221d and the distance between the edge 211e and the edge 221e is "α/2". Further, in one or more embodiments, the distance between edge 211d and the center line 213b is greater than the distance between edge 221d and the center line 213b.

As illustrated in FIG. 2C, the center 213a of the bump 210a differs from the center 223a of the exposed surface 290 of the pad 220a that is exposed through the dielectric material 280. Further, the distance between a first edge of the bump 210a and a first edge of the pad 220a is different than a distance between a second edge of the bump 210a and a second edge of the pad 220a. For example, the distance between the edge 211a of the bump 210a and the edge 221a of the exposed surface 290 of the pad 220a is larger than the distance between the edge 211b of the bump 210a and the edge 221b of the exposed surface 290 of the pad 220a. In one embodiment, the distance between the edge 211a and the edge 221a is "α" and the distance between the edge 211b and the edge 221b is "β" where "α" is greater than "β." Alternatively, the distance "β" may be greater than the distance "α." In one or more embodiments, the distance between the edge 211a and the center line 205 is less than the distance between the edge 221a and the center line 205 of the die 202 of IC chip 200, as shown in FIG. 2A.

Returning to FIG. 2A, the bumps 210 are arranged in a plurality of rows and columns. For example, the bumps 210a, 210e, 210i, and 210m are in a first column. The bumps 210b, 210f, 210j, and 210n are in a second column, and the bumps 210c, 210g, 210k, and 210o are in a third column. Further, the bumps 210d, 210h, 210l, and 210p are in a fourth column. The bumps 210a-210d are in a first row, the bumps 210e-210h are in a second row, the bumps 210i-220l are in a third row, and the bumps 210m-210p are in a fourth row.

In one embodiment, each bump 210 of a column is configured in similar way. For example, the bumps 210b, 210f, 210j, and 210n are configured such that the center of each of the bumps 210b, 210f, 210j, and 210n is aligned with a center of a corresponding pad 220. Further, the bumps 210a, 210e, 210i, and 210m are configured such that the center of each of the bumps 210a, 210e, 210i, and 210m is not aligned with (i.e., laterally offset from) a center of a corresponding pad 220 along the direction of the orientation of the row.

The IC chip 200 may include more than 4 columns of bumps and/or more than 4 rows of bumps. The pitch between bumps of a common row and on the same side of the center line 205 may vary. For example, FIG. 3A illustrates three bumps 210 disposed in common row and arranged on the same side of the center line 205. In the embodiment of FIG. 3A, the pitch (i.e., the center to center distance between adjacent bumps 210) differs between the bumps 210a and 210q and between bumps 210q and 210b. For example, a pitch $P_1$ defined between the bumps 210a and 210q is smaller than a pitch $P_2$ defined between the bumps 210q and 210b. Further, the distance between bumps can vary along a common row. For example, a distance $D_1$ between the bumps 210a and 210q is less than a distance $D_2$ between the bumps 210q and 210b.

Figure 3B:
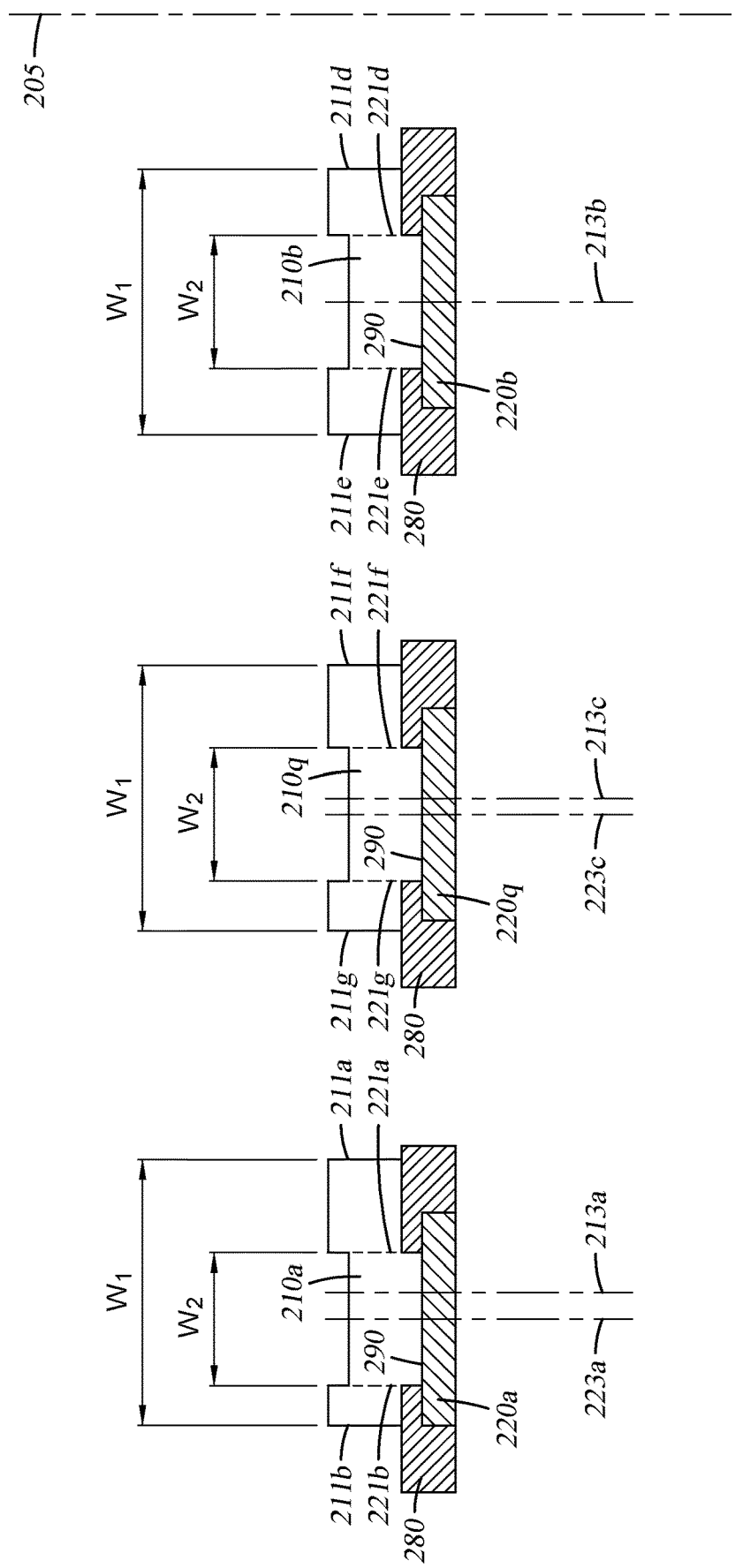
FIG. 3B illustrates a portion of the bumps and pads of a die of an integrated circuit chip, according to one or more embodiments.

The pitch between bumps and/or distance between bumps may vary along a common row. Similarly, the distance between the center of each bump and a corresponding pad may vary along the common row. For example, FIG. 3B is a cross-sectional side view of bumps and pads, illustrating the difference between the center of each bump 210a, 210q, and 210b and a corresponding pad 220a, 220q, and 220b, according to one or more embodiments. As illustrated, the center 213b of the bump 210b is also the center of the pad 220b. As is described above, while the width $W_1$ of the bump 210b is larger than the exposed width $W_2$ of the pad 220b, the distance between the edge 211d of the bump 210b and the edge 221d of the exposed surface 290 of the pad 220b is the same as the distance between the edge 211e of the bump 210b and the edge 221e of the exposed surface 290 of the pad 220b. The center 213c of the bump 210q is not aligned with the center 223c of the pad 220q. Further, as the distance between the edge 211f of the bump 210q and the edge 221f of the exposed surface 290 of the pad 220q is greater than the distance between the edge 211g of the bump 210q and the edge 221g of the exposed surface 290 of the pad 220q. The center 213c of the bump 210q is closer to the center line 205 of the die 202 of IC chip 200 than the center 223c of the pad 220q. The distance between the edge 211f of the bump 210q and the edge 221f of the exposed surface 290 of the pad 220q is greater than the distance between the edge 211d of the bump 210b and the edge 221d of the exposed surface 290 of the pad 220b. Further, the distance between the edge 211g of the bump 210q and the edge 221g of the exposed surface 290 of the pad 220q is less than the distance between the edge 211e of the bump 210b and the edge 221e of exposed surface 290 of the pad 220b.

The bump 210a and the pad 220a are configured similar to that as described above with regard to FIG. 2C. For example, the distance between the edge 211a of the bump 210a and the edge 221a of the exposed surface 290 of pad 220a is greater than distance between the edge 211b of the bump 210a and the edge 221b of the exposed surface 290 of pad 220a. The center 213a is not aligned with the center 223a. Further, the distance between the edge 211a of the bump 210a and the edge 221a of the exposed surface 290 of the pad 220a is greater than the distance between the edge 211f of the bump 210q and the edge 221f of the exposed surface 290 of the pad 220q, and also greater than the distance between the edge 211d of the bump 210b and the edge 221d of the exposed surface 290 of the pad 220b. Further, the distance between the edge 211b of the bump 210a and the edge 221b of the exposed surface 290 of the pad 220a is less than the distance between the edge 211g of the bump 210q and the edge 221g of the exposed surface 290 of the pad 220q and also the distance between the edge 211e of the bump 210b and the edge 221e of the exposed surface 290 of the pad 220b. Further, in one or more embodiments, the center 213a of the bump 210a is closer to the center line 205 than the center 223a of the pad 220a. Thus in the example of FIG. 3B, the distance between centers of each bump and pad pair is greater the farther each bump and pad pair is from the center line 205 of the die 202 of IC chip 200.

Figure 4A:
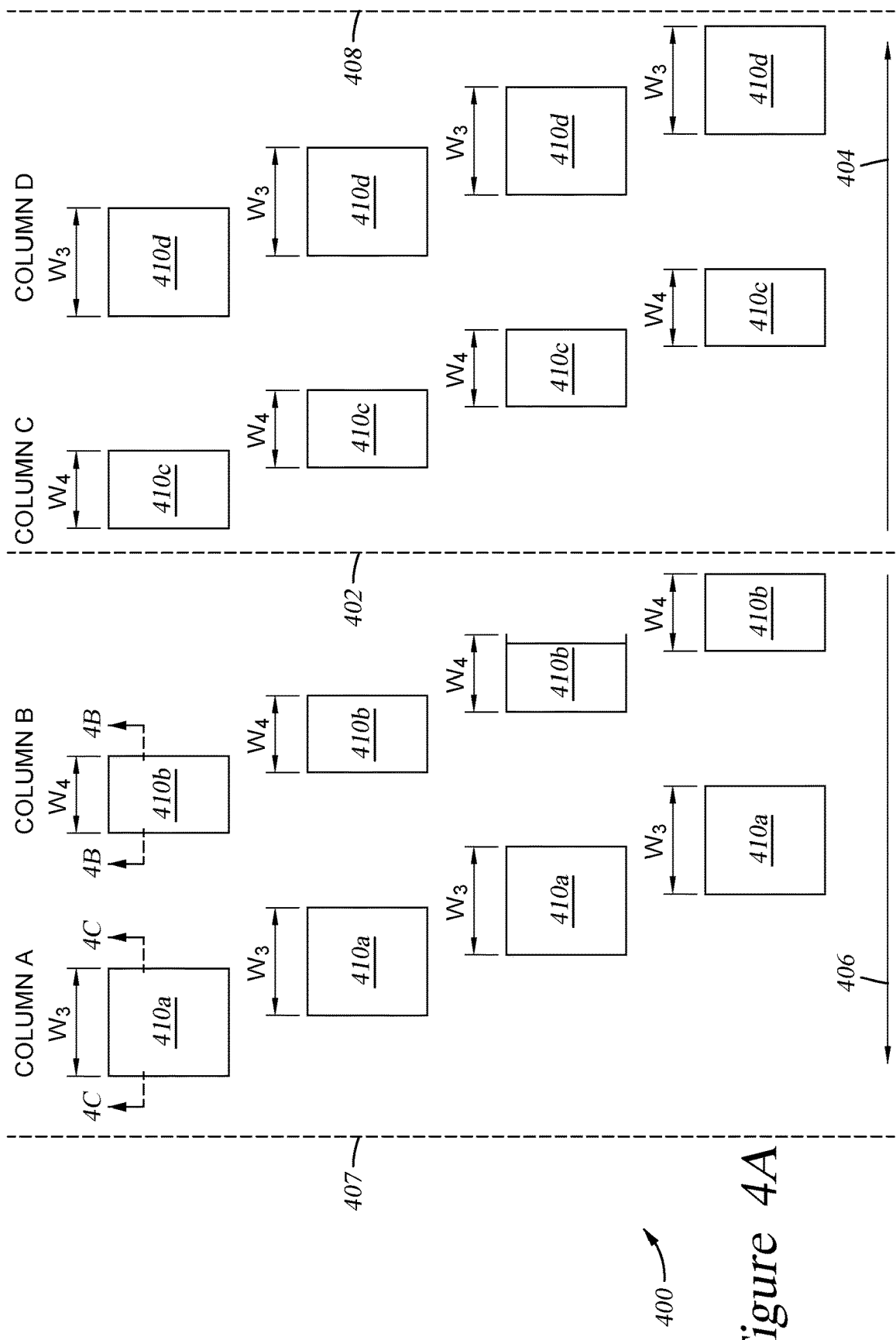
FIG. 4A illustrates a cross-sectional view of a portion of a die of an integrated circuit chip, according to one or more embodiments.

FIG. 4A illustrates a portion of a die of an IC chip 400, according to one or more embodiments. In the embodiment of FIG. 4A, the IC chip 400 includes bumps 410. The bumps 410 of columns A and D have a width $W_3$, and the bumps 410 of columns B and C have a width $W_4$. Within a common row, the bumps 410a and the bumps 410d are the same number of bumps from the center line 402 of the IC chip 400, and have a common width $W_3$. In one embodiment, the width $W_3$ is greater than the width $W_4$. Further, each bump 410 in a common column, for example the bumps 410a comprising column A, has a common width.

In one or more embodiments, the width of the bumps 410 increases corresponding to a distance that the bump 410 is from the center line 402 of the IC chip 400. For example, the increase in the width of the bumps 410 is based upon a distance from the center line 402 along a direction 404 and a direction 406. The directions 404, 406 point in opposite directions, and are orthogonal to the center line 402. In one embodiment, bumps 410 located closer to an outer edge (e.g., outer edge 407 or 408) of the die of the IC chip 400 has a width larger than the bumps located closer to the center line 402 of the IC chip 400.

Figure 4B:
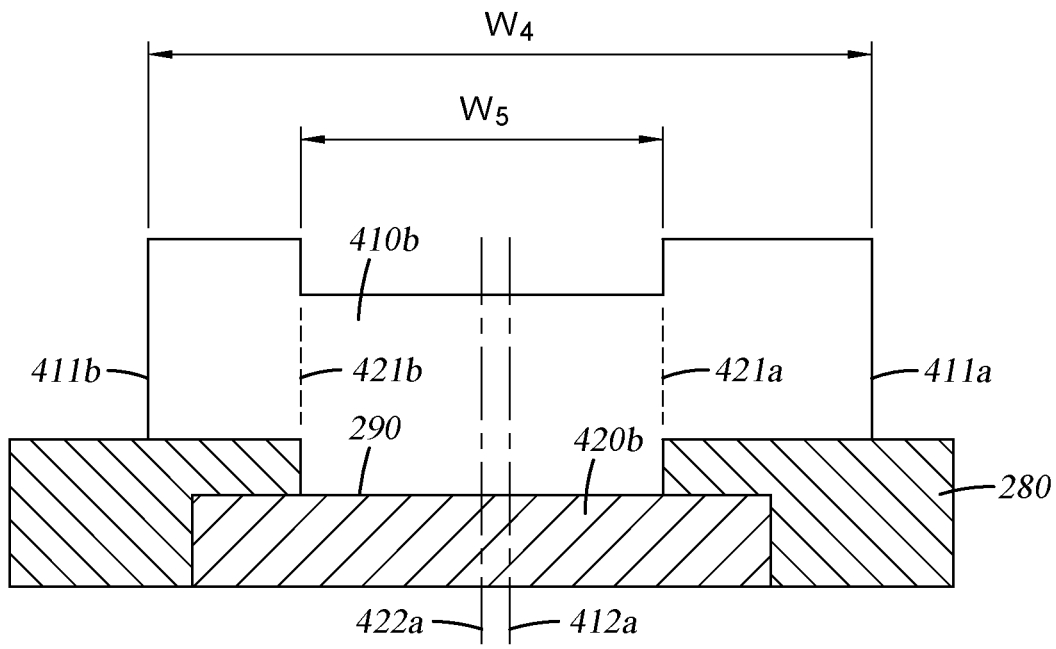
FIGS. 4B and 4C illustrate cross-sectional views of a portion of the bumps and pads of a die of an integrated circuit chip taken through section lines 4B-4B and 4C-4C shown in FIG. 4A, according to one or more embodiments.
Figure 4C:
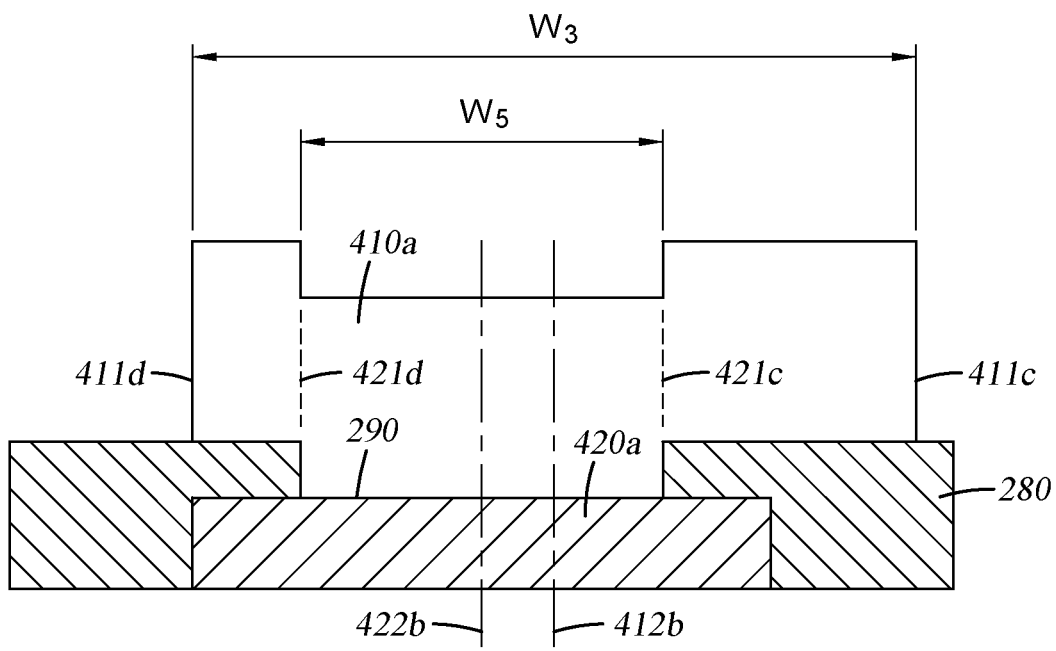

FIGS. 4B and 4C illustrate cross-sectional side views of example bumps (e.g., bumps 410a and 410b) and pads (e.g., pads 420a and 420b) taken through section lines 4B-4B and 4C-4C shown in FIG. 4A, according to one or more embodiments. The bumps 410 overlap the pads 420 as described above to facilitate electrical connection between the IC chip 400 and the substrate to which the IC chip 400 is mounted. In the embodiment illustrated in FIG. 4B, the width $W_4$ of the bump 410b is greater than the exposed width $W_5$ of the pad 420b. Further, the distance between the edge 411a of the bump 410b and the edge 421a of the exposed surface 290 of the pad 420b is greater than the distance between the edge 411b of the bump 410b and the edge 421b of the exposed surface 290 of the pad 420b. The center 412a of the bump 410b is not aligned with the center 422a of the pad 420b. For example, the center 412a is closer to the center line 402 (shown in FIG. 4A) than the center 422a. Additionally, or alternatively, the edge 411a of the bump 410b is closer to the center line 402 than the edge 421a of the exposed surface 290 of the pad 420b.

As illustrated in FIG. 4C, the width $W_3$ of the bump 410a is greater than the width $W_5$ of the exposed surface 290 of the pad 420a. The distance between the edge 411c of the bump 410a and the edge 421c of the exposed surface 290 of the pad 420a is greater than the distance between the edge 411d of the bump 410a and the edge 421d of the exposed surface 290 of the pad 420a. The center 412b of the bump 410a is not aligned with the center 422b of the pad 420a. For example, the center 412b is closer to the center line 402 of the IC chip 400 depicted in FIG. 4A than the center 422b. Additionally, or alternatively, the edge 411c of the bump 410a is closer to the center line 402 of the IC chip 400 depicted in FIG. 4A than the edge 421c of the exposed surface 290 of the pad 420a.

Figure 5:
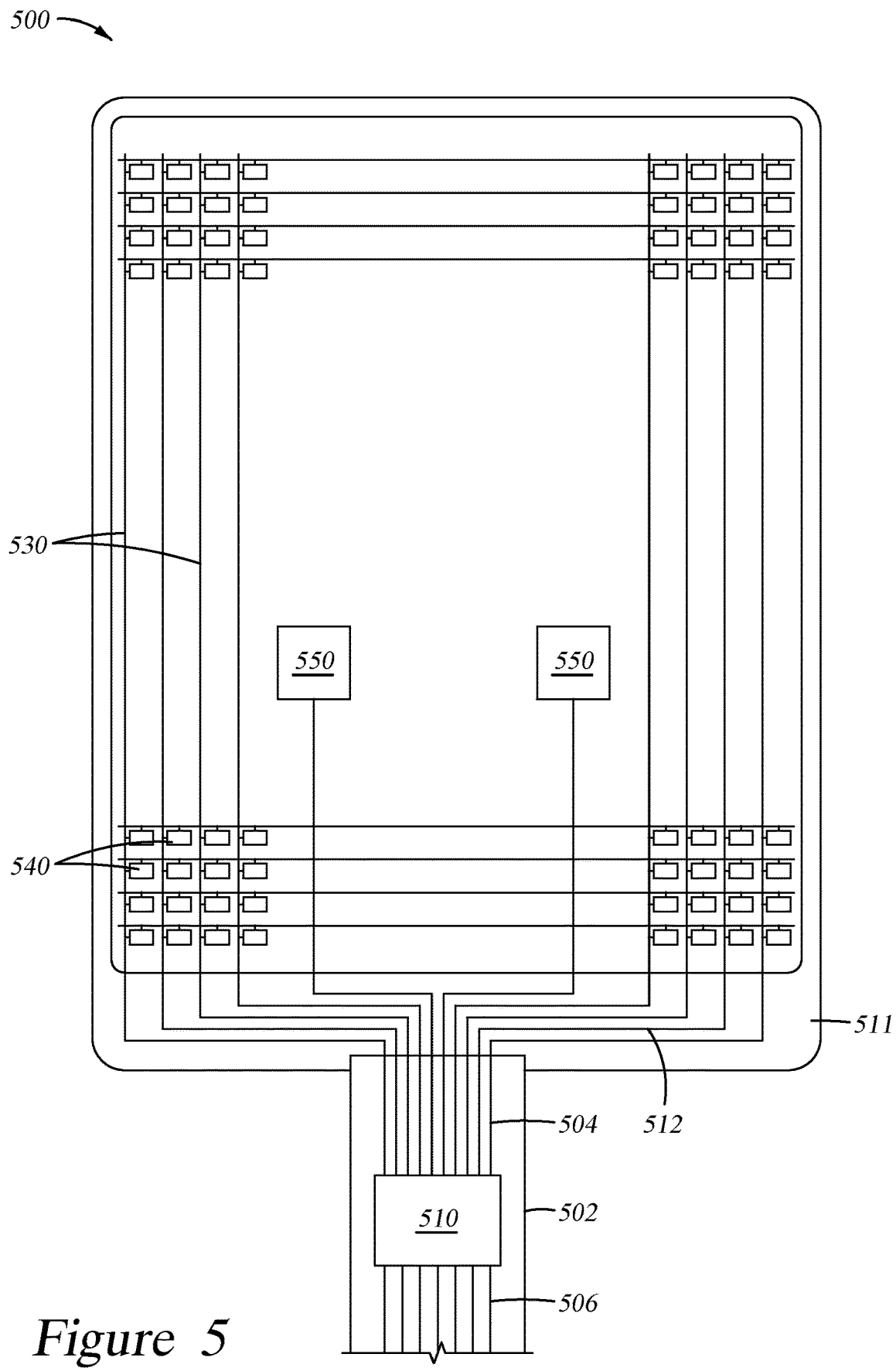
FIG. 5 illustrates an example electronic device, according to one or more embodiments.

FIG. 5 illustrates an example electronic device 500 coupled to a connector 502, according to one or more embodiments. The electronic device 500 is a display device, an input device, or a combination thereof. An IC chip 510 of the electronic device 500 is mounted to the connector 502 as described above. In various embodiments, the connector 502 is a flexible connector as described above. Alternatively, the connector 502 is a substrate that is substantially rigid. The IC chip 510 is a DDIC chip, a TDDI chip, or another type of ASIC, among others. Further, the IC chip 510 is formed similar to the IC chip 200 and the IC chip 400 as described above. In one embodiment, the connector 502 is omitted (i.e., not present) and the IC chip 510 is coupled directly to a substrate 511 of the electronic device 500.

The IC chip 510 includes one or more pads (e.g., the pads 220, 420) and one or more bumps (e.g., bumps 210, 410) coupled to one or more bumps and pads of the connector 502. In one embodiment, the bumps and pads of the connector 502 mechanically and electrically couple the bumps and pads of the IC chip 510 to the traces 512 and the display electrodes of the electronic device 500. The traces 504 are disposed on the connector 502. Further, the connector 502 is coupled to the substrate 511 of the electronic device 500. In one embodiment, the traces 504 are coupled to traces 512 and drive lines 530 disposed on the substrate 511 such that display update signals output by the IC chip 510 are coupled to subpixels 540 to update a display image on a display device. In various embodiments, the number of traces 504 and 512 differ from what is illustrated in the embodiment of FIG. 5. For example, traces 504, 512 and drive lines 530 include hundreds or thousands of traces and line, and/or have different routings.

The electronic device 500 includes sensor electrodes 550. The sensor electrodes 550 are coupled to the IC chip 510 via the traces 504. Further, the IC chip 510 is configured to drive the sensor electrodes 550 with sensing signals and receive resulting signals from the sensor electrodes 550 to detect the presence of an input object, such as a finger, styli, active pen and the like. The IC chip 510 is configured to process the resulting signals to detect and determine a position of the input object relative to the electronic device 500. While only two sensor electrodes are illustrated, the electronic device 500 includes tens or hundreds (or more) of sensor electrodes 550. Further, the size and/or shape the sensor electrodes 550 may differ from that illustrated in FIG. 5. For example, the sensor electrodes 550 have a rectangular shape, a square shape, or an elliptical shape, among others. Further, the sensor electrodes 550 may be similar in size or differ in size from each other. In one embodiment, the sensor electrodes 550 are formed from one or more electrodes of a display device. In one or more embodiments, the electronic device 500 does not include the sensor electrodes 550.

In one or more embodiments, the bumps (e.g., the bumps 210, 410) and the pads (e.g., the pads 220, 420) of the IC chip 510 are electrically and mechanically coupled to the one or more bumps and pads of the substrate 511. Further, the bumps and pads of the substrate 511 couple the bumps and pads of the IC chip to the traces 512 and the drive lines 530. For example, the bumps and the pads of the substrate 511 couple the bumps and the pads of the IC chip 510 to the traces 512 and the drive lines 530 such that display update signals output by the IC chip 510 are coupled to the drive lines 530.

In one embodiment, the connector 502 includes traces 506 which couple the IC chip 510 to a controller of a host device (not shown). The host device may be a mobile phone, tablet device, laptop, an internet of things (IoT) device, or part of an automobile, among others. The controller may be a central processing unit (CPU) or a graphics processing unit (GPU), among others. The IC chip 510 receives display data and other control signals form the host device via the traces 506. The number of traces 506 may differ from that illustrated in FIG. 5. For example, the traces 506 include more than 10 traces.

Figure 6:
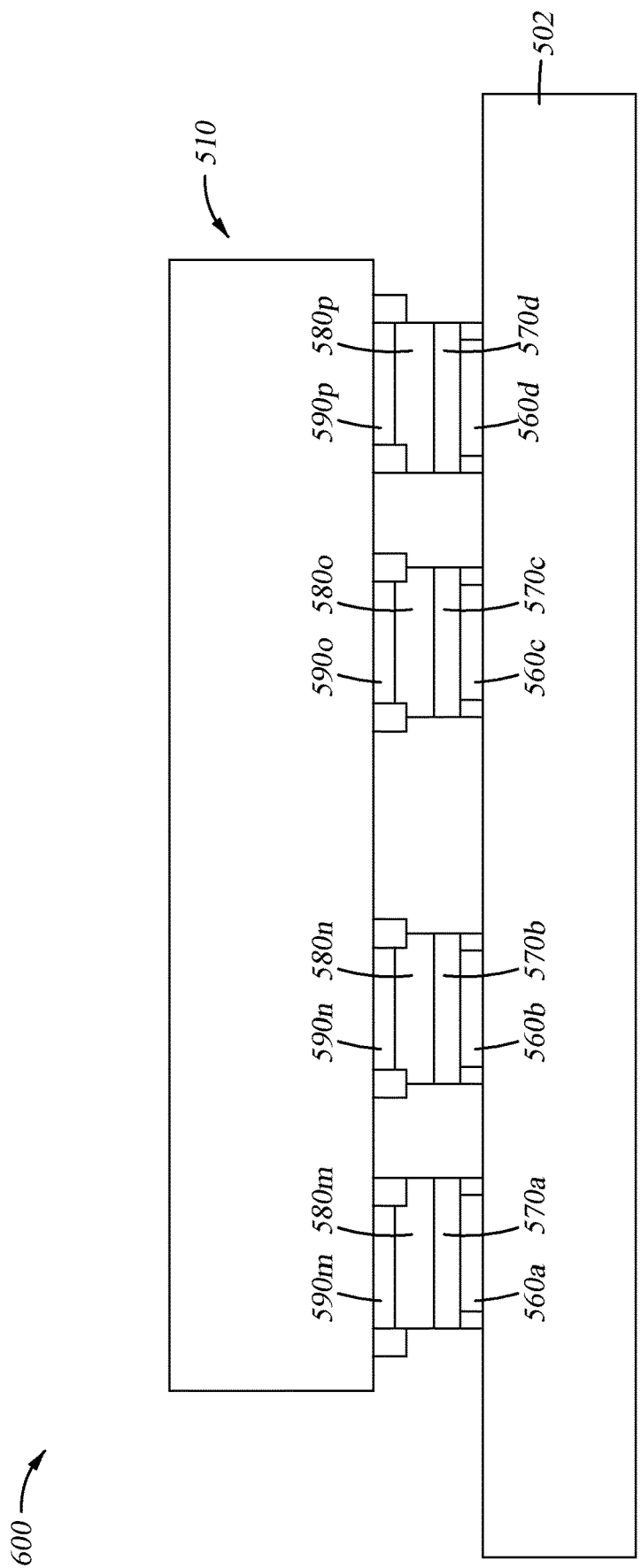
FIG. 6 is a cross-sectional view of a portion of an IC chip module having an IC chip and a connector, according to one or more embodiments.

FIG. 6 is a cross-sectional view of a portion of an IC chip module comprising the IC chip 510 and the connector 502, according to one or more embodiments. The IC chip 510 is mounted to the connector 502 via a crimping process. Alternatively, the IC chip 510 is mounted to the connector 502 via other IC chip mounting processes. As illustrated in FIG. 6, the IC chip 510 includes bumps 580 (e.g., 580m-580p) and pads 590 (e.g., 590m-590p). The bumps 580m-580p are configured similar to the bumps 210m-210p of FIG.

2A. Alternatively, the bumps 580m-580p may be configured similar to bumps 410a-410d of FIG. 4A.

Each of the bumps 580 is coupled to a corresponding pad 590. For example, the bump 580m is electrically connected to the pad 590m, the bump 580n is electrically connected to the pad 590n, the bump 580o is electrically connected to the pad 590o, and the bump 580p is electrically connected to the pad 590p. Further, the bumps 580 are electrically coupled to corresponding bumps 570 of the connector 502. Each of the bumps 570 is electrically coupled to a corresponding one of the pads 560 of the connector 502. For example, the bump 570a is electrically connected to the pad 560a, the bump 570b is electrically connected to the pad 560b, the bump 570c is electrically connected to the pad 560c, and the bump 570d is electrically connected to the pad 560d. The pads 560 are coupled to the traces 504 and/or the traces 506 as illustrated in FIG. 5.

Thus, the embodiments and examples set forth herein were presented in order to best explain the embodiments in accordance with the present technology and its particular application and to thereby enable those skilled in the art to make and use the disclosure. However, those skilled in the art will recognize that the foregoing description and examples have been presented for the purposes of illustration and example only. The description as set forth is not intended to be exhaustive or to limit the disclosure to the precise form disclosed.

In view of the foregoing, the scope of the present disclosure is determined by the claims that follow.

What is claimed is:

1. An integrated circuit (IC) chip comprising:
a plurality of pads including a first pad; and
a plurality of bumps disposed on the plurality of pads, the plurality of bumps including:
a first bump disposed on the first pad, wherein the first bump has a width that is different than an exposed width of the first pad, and wherein a center of the first bump is not aligned with a center of the first pad; and
a second bump, a third bump and a fourth bump all disposed with the first bump in a common row, the first and third bumps disposed closest to and on opposite sides of a center line of the IC chip, the second bump disposed on the same side of the center line as the first bump, the fourth bump disposed on the same side of the center line as the third bump,
wherein the first and third bumps have a first common width and the second and fourth bumps have a second common width, and wherein the first common width and the second common width are different.

2. The IC chip of claim 1, wherein a distance between the first bump and the second bump differs from a distance between the second first bump and the third bump.

3. The IC chip of claim 1, wherein a center of the second bump of the plurality of bumps is aligned with a center of a corresponding one of the plurality of pads.

4. The IC chip of claim 1, wherein the IC chip is configured to update a display image on a display device.

5. The IC chip of claim 1, wherein the IC chip is configured to update a display image on a display device and to detect one or more input objects on an input device.

6. An electronic device comprising:
a substrate comprising first traces;
a connector coupled to the substrate and comprising:
first connector bumps; and
second traces coupled to the first connector bumps and the first traces; and
an integrated circuit (IC) chip comprising:
a plurality of pads including a first pad; and
a plurality of IC chip bumps disposed on the plurality of pads, the plurality of IC chip bumps including a first IC chip bump disposed on the first pad, wherein the first IC chip bump has a width that is different than an exposed width of the first pad, and wherein a center of the first IC chip bump is not aligned with a center of the first pad,
wherein the plurality of IC chip bumps are arranged in a plurality of rows and columns, wherein a first width of the first IC chip bump differs from a second width of a second IC chip bump of the plurality of IC chip bumps, and wherein the first IC chip bump and the second IC chip bump are disposed in a first row of the plurality of rows.

7. The electronic device of claim 6, wherein the plurality of IC chip bumps further comprises:
a third IC chip bump and a fourth IC chip bump disposed in the first row, the first and third IC chip bumps disposed closest to and on opposite sides of a center line of the IC chip, the second and fourth IC chip bumps disposed on opposite sides of the center line, the first and third IC chip bumps having a first common width and the second and fourth IC chip bumps having a second common width, the second common width larger than the first common width.

8. The electronic device of claim 6, wherein a center of the first IC chip bump is aligned with a center of a corresponding one of the pads.

9. The electronic device of claim 6 further comprising a display device, and wherein the IC chip is configured to update a display image on the display device.

10. The electronic device of claim 6 further comprising a display device and an input device, wherein the IC chip is configured to update a display image on the display device and detect one or more input objects on the input device.

11. An integrated chip (IC) module comprising:
a connector comprising connector bumps; and
a die comprising:
a plurality of pads including a first pad; and
a plurality of die bumps disposed on the plurality of pads, the plurality of die bumps including a first die bump disposed on the first pad, wherein the first die bump has a first width that is different than an exposed width of the first pad, and wherein a center of the first die bump is not aligned with a center of the first pad,
wherein the plurality of die bumps are arranged in a plurality of rows and columns, wherein the first width of the first die bump differs from a second width of a second dies bump of the plurality of die bumps, and wherein the first die bump and the second die bump are disposed in a first row of the plurality of rows.

12. The IC chip module of claim 11, wherein the plurality of die bumps further comprises:
a third die bump arranged in a common row with the first die bump and the second die bump, and wherein a distance between the first die bump and the second die bump is different than a distance between the second die bump and the third die bump.

13. The IC chip module of claim 11, wherein a center of the second die bump of the plurality of die bumps is aligned with a center of an exposed surface of a corresponding one of the pads.

* * * * *

UNITED STATES PATENT AND TRADEMARK OFFICE
CERTIFICATE OF CORRECTION

| | | |
|---|---|---|
| PATENT NO. | : 11,177,229 B2 | Page 1 of 1 |
| APPLICATION NO. | : 16/838047 | |
| DATED | : November 16, 2021 | |
| INVENTOR(S) | : Naoki Hasegawa et al. | |

It is certified that error appears in the above-identified patent and that said Letters Patent is hereby corrected as shown below:

On the Title Page

Item [57], Line 5, the word "as" should read -- has --.

Item [57], Line 6, the word "with" should read -- width --.

In the Claims

Column 9, Claim 2, Line 53, the word "first" should be deleted.

Column 10, Claim 11, Line 52, the word "dies" should read -- die --.

Signed and Sealed this
Eighth Day of February, 2022

Drew Hirshfeld
*Performing the Functions and Duties of the
Under Secretary of Commerce for Intellectual Property and
Director of the United States Patent and Trademark Office*